(12) United States Patent
Wilson et al.

(10) Patent No.: US 6,423,980 B1
(45) Date of Patent: Jul. 23, 2002

(54) MULTI-DIRECTIONAL RADIATION COUPLING IN QUANTUM-WELL INFRARED PHOTODETECTORS

(75) Inventors: Daniel W. Wilson, Glendale; John K. Liu, Pasadena; Sumith V. Bandara; Sarath D. Gunapala, both of Valencia, all of CA (US)

(73) Assignee: California Institute of Technology, Pasadena, CA (US)

( * ) Notice: Subject to any disclaimer, the term of this patent is extended or adjusted under 35 U.S.C. 154(b) by 17 days.

(21) Appl. No.: 09/575,678

(22) Filed: Jun. 26, 2000

Related U.S. Application Data

(60) Provisional application No. 60/141,185, filed on Jun. 25, 1999.

(51) Int. Cl.[7] .............................................. H01L 29/06
(52) U.S. Cl. ........................ 257/21; 257/436; 257/460; 438/32
(58) Field of Search ........................ 257/21, 436, 460; 250/338.4; 359/562, 563, 572, 575; 438/32

(56) References Cited

U.S. PATENT DOCUMENTS

| | | | |
|---|---|---|---|
| 4,536,608 A | | 8/1985 | Sheng et al. |
| 5,198,659 A | | 3/1993 | Smith et al. |
| 5,229,614 A | * | 7/1993 | Andersson et al. .... 250/370.12 |
| 5,272,356 A | | 12/1993 | Wen et al. |
| 5,384,469 A | | 1/1995 | Choi |
| 5,470,761 A | | 11/1995 | McKee et al. |
| 5,485,015 A | | 1/1996 | Choi |
| 5,528,051 A | | 6/1996 | Nuyen |
| 5,539,206 A | | 7/1996 | Schimert |
| 5,552,603 A | | 9/1996 | Stokes |
| 5,563,423 A | * | 10/1996 | Wu et al. .................... 257/21 |
| 5,818,066 A | * | 10/1998 | Duboz ......................... 257/21 |
| 6,271,537 B1 | | 8/2001 | Gunapala et al. |

OTHER PUBLICATIONS

Gunapala, Sarath D. et al., "15–Micrometer 128x128 GaAs/Al×Ga1–xs As Quantum Well Infrared Photodector Focal Plane Array Camera," IEEE Transactions on Electron Devices, vol. 44, No. 1, Jan. 1997 (01.97), pp. 45–50.

Gunapala, Sarath D. et al., "9–micrometer 256x256 GaAs/AlxGa1–As Quantum Well Infrared Photodector Hand–Held Camera," IEEE Transactions on Electron Devices, vol. 44, No. 1, Jan. 1997 (01.97), pp. 51–57.

Gunapala, Sarath D. et al., "Long–Wavelength 640×486 GaAs/AlxGa1–xAs Quantum Well Infrared Photodector Snap–Shot Camera," IEEE Transactions on Electron Devices, vol. 45, No. 9, Sep. 1998 (09.98), pp. 1890–1895.

Andersson et al., "Near–unity quantum efficiency of AlGaAs/GaAs quantum well infrared detectors using a waveguide with a doubly periodic grating coupler," Applied Physics Letters, vol. 59, No. 7, pp. 857–859, Aug. 12, 1991.

Sarusi et al., "Improved performance of quantum well infrared photodectors using random scattering optical coupling," Applied Physics Letters, vol. 64, No. 8, pp. 960–962, Feb. 21, 1994.

Bandara et al., "Optical coupling mechanisms in quantum well infrared photodectors," SPIE vol. 2999, pp. 103–108, 1997.

\* cited by examiner

Primary Examiner—Sara Crane
(74) Attorney, Agent, or Firm—Fish & Richardson P.C.

(57) ABSTRACT

Techniques for coupling radiation into a quantum-well detector by using a two-dimensional array of grating cells to form at least three different grating directions to provide efficient coupling.

21 Claims, 2 Drawing Sheets

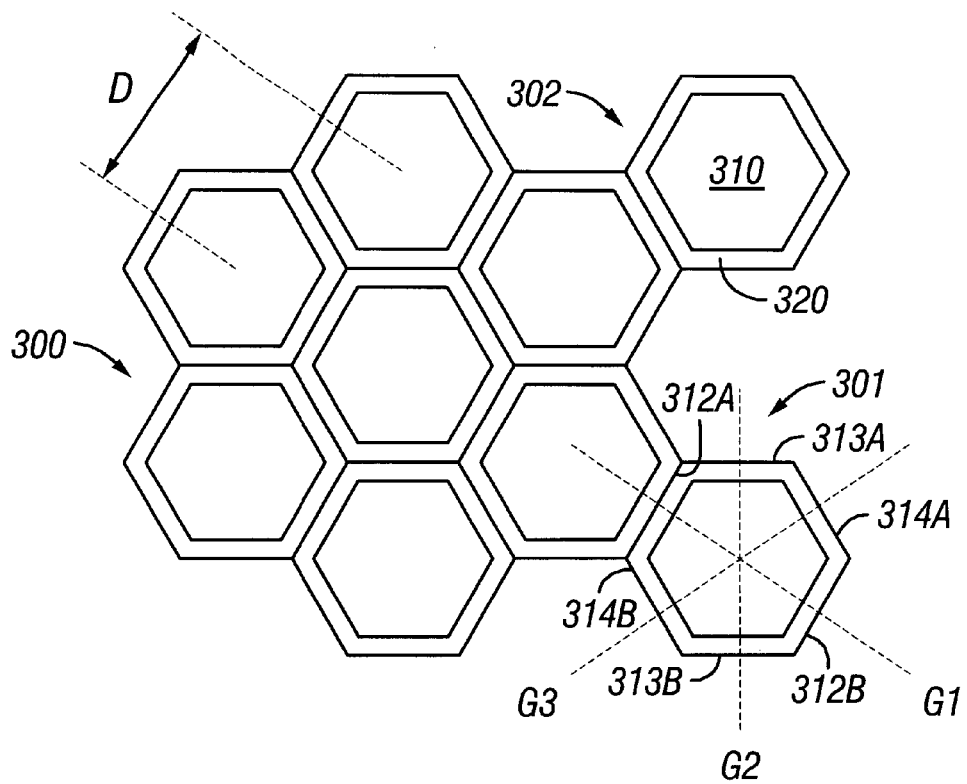
FIG. 3
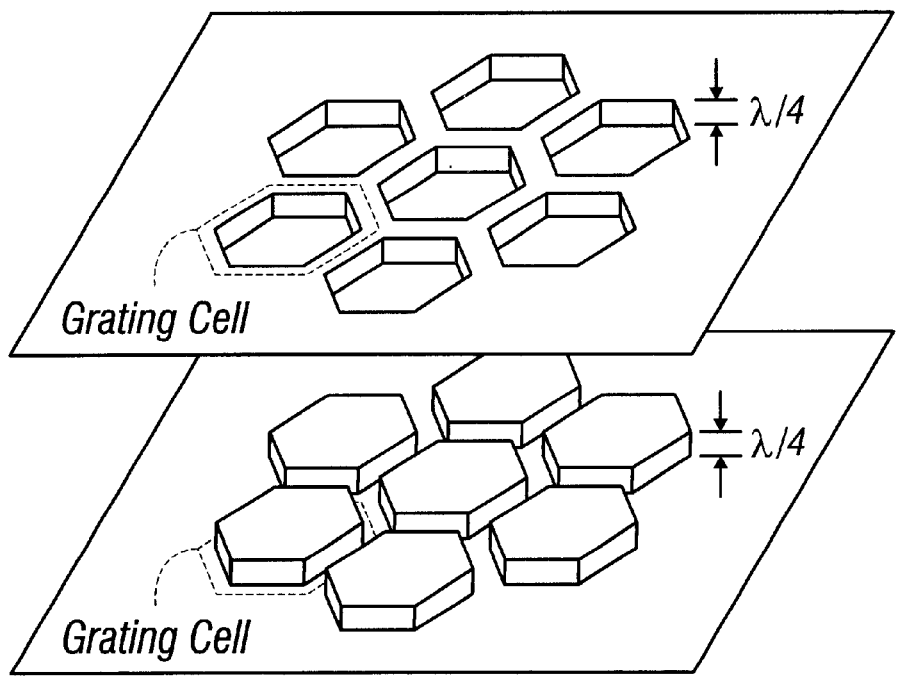
FIG. 4A
FIG. 4B

MULTI-DIRECTIONAL RADIATION COUPLING IN QUANTUM-WELL INFRARED PHOTODETECTORS

CROSS REFERENCE TO RELATED APPLICATIONS

Continuity Statement This application claims the benefit of U.S. Provisional Application No. 60/141,185, filed on Jun. 25, 1999.

FEDERAL RESEARCH STATEMENT

The devices and techniques described herein were made in the performance of work under a NASA contract, and are subject to the provisions of Public Law 96-517 (35 U.S.C. §202) in which the Contractor has elected to retain title.

BACKGROUND OF INVENTION

This application relates to quantum-well radiation detectors, and more specifically, to radiation coupling to quantum-well photodetectors.

Quantum-well structures can be used to construct photodetectors to detect radiation with a high sensitivity. One type of quantum-well photodetectors use light absorption by transitions between different quantum energy states within the same band, either the conduction or the valance band of their quantum-well structures. Such transitions within the same band are also referred to as intersubband transitions.

Quantum physics dictates that an intersubband transition is excited to absorb photons of input radiation only when the electric field of the photons (i.e., the polarization) has a component along the growth direction of a quantum-well structure, i.e., perpendicular to the quantum layers. A coupling mechanism is often implemented in such quantum-well detectors to achieve the above-desired coupling condition. Random reflectors, corrugated surfaces, and grating couplers have been used to convert normally incident radiation to waves have components that propagate along the quantum well layers.

SUMMARY OF INVENTION

The present disclosure includes techniques for coupling radiation to a quantum-well detector based on intersubband transitions by using a special grating coupler. In one embodiment, this special grating includes a two-dimensional array of periodic grating cells. Each cell is shaped to define at least three different grating directions.

A central region and a peripheral region of different thickness values may be included in each cell to reduce the amount of energy in the zeroth diffraction order of the grating coupler. The peripheral region conforms to and surrounds the central region. The difference in optical thickness of the central and peripheral regions may be about one quarter of a selected radiation wavelength. In addition, the areas of the central and peripheral regions may be substantially the same.

This grating coupler may be formed directly over the quantum-well detector so that the array of the grating cells is substantially parallel to the quantum well layers of the detector. A conductive contact layer may be formed over the grating coupler is electrically biased relative to another contact layer formed on the other side of the quantum well layers.

BRIEF DESCRIPTION OF DRAWINGS

FIG. 3 shows hexagonal structure of the polygon grating cells of FIG. 1 according to one implementation.

FIGS. 4A and 4B illustrate two different configurations of the hexagonal structure shown in FIG. 3.

DETAILED DESCRIPTION

An optical grating includes a periodic structure to interact with light. The interference between diffracted light from the periodic structure produces a diffraction field in which the energy is distributed according to the Bragg phase matching conditions. Specifically, only certain diffraction directions that satisfy the Bragg phase matching conditions have constructive interference (i.e., bright spots) while all other directions have destructive interference (i.e., "dark spots"). The present radiation coupling is in part based on a two-dimensional periodic structure with a unique design to provide periodic perturbation to light in multi directions within a plane, i.e., more than three different directions. This can be used to couple radiation to an intersubband transition quantum-well detector with a high coupling efficiency.

Figure 1:
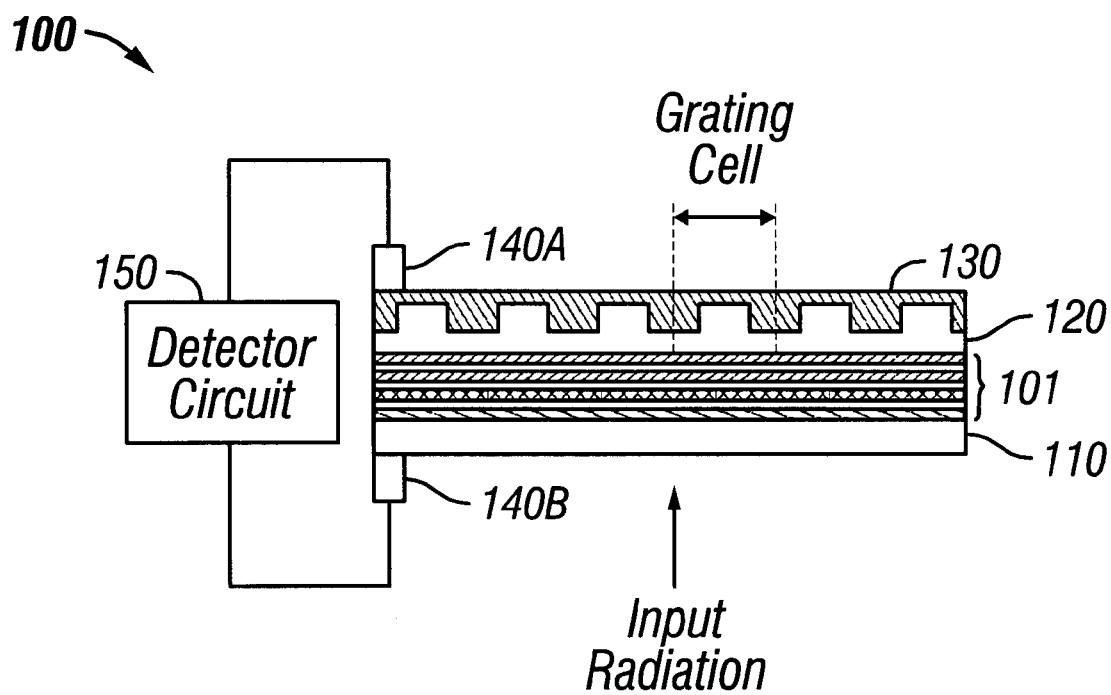
FIG. 1 shows one embodiment of an integrated intersubband-transition quantum-well detector with a multi-directional grating coupler formed of a two-dimensional array of polygon grating cells.

FIG. 1 shows one embodiment of an intersubband-transition quantum-well detector 100 with a multi-directional grating coupler 120. A semiconductor substrate is processed to form a quantum-well detector layer 101 with a single or an array of quantum-well detectors. The quantum-well detector layer 101 includes multiple quantum well layers of alternating barrier and active semiconductor layers that are perpendicular to their growth direction. Such a structure can be designed to support intersubband transitions, which are usually in the infrared spectral range.

On one side of the quantum well detector layer 101, a transparent contact layer 110 is formed in parallel with the quantum well layers from a doped semiconductor material. The doping level in the contact layer 110 is sufficient to make it electrically conductive to provide a proper electrical bias to that side of the detector layer 101. An antireflective layer for one wavelength or a spectral range of the radiation to be detected may be formed on the side of the contact layer 110 that is not in contact with the detector layer 101. The index of refraction of the contact layer 110 is generally different from and is higher than that of the air. Hence, the interface between the contact layer 110 and the air is at least partly reflective due to this index difference. A beam reflected from the grating layer 120 can then be reflected at this interface back to the detector layer 101 to be further absorbed and hence to increase the detector efficiency. In operation, this side of the detector layer 101 is used as the receiving side to receive an input beam.

The grating coupler 120 is formed on the other side of the detector layer 101 opposite to the side with the contact layer 110. A doped and conducting semiconductor contact layer is first formed in contact with this side of the detector layer 101. Then the layer is patterned to form multiple identical grating cells, which are evenly spaced from one another to form a periodic two-dimensional grating cell array. Each grating cell has a polygon geometry with three or more pairs of opposing and parallel sides. The direction perpendicular to each pair of opposing and parallel sides defines one grating direction. Hence, the grating cell array has three or more grating directions.

This grating coupler 120 serves at least two different functions. One is a grating operation to diffract an input beam along three or more different grating directions within the plane of the coupler 101. This grating may be designed to operate in a reflection mode, i.e., the constructive diffraction orders are reflected back. Another function is to operate as a contact layer, similar to the contact layer 110, to provide a proper electrical bias to the detector layer 101. The electrical potentials applied to the layers 110 and 120 are different from each other to create a voltage drop across the quantum well detector layer 101 and hence to activate it.

The detector 100 may also include a reflective layer 130 to ensure that an input beam transmitted through the detector layer 101 is reflected back. This increases the detection efficiency. In addition, this reflective layer 130 may be made of a metallic layer, as illustrated in FIG. 1, by using a metalization process so that it can be used as an ohmic contact. Electrical contact nodes 140A and 140B, which may be made of Indium, can be formed in ohmic contact with the conducting reflective layer 130 and the conducting transparent contact layer 110, respectively. A detector circuit 150 may be coupled to the nodes 140A and 140B.

Figure 2:
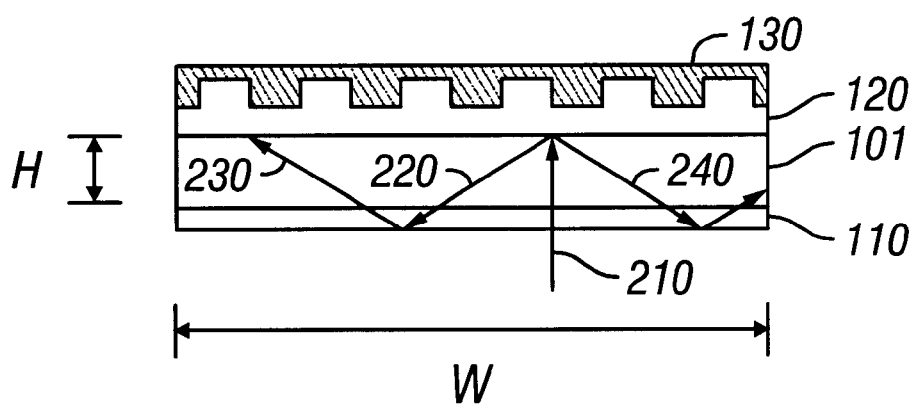
FIG. 2 shows typical optical paths within the detector in FIG. 1 when an input beam is incident to the receiving side of the detector at the normal direction.

FIG. 2 illustrates the typical operation of the detector 100 when an input beam 210 is incident approximately at the normal direction to the quantum well layers in the detector layer 101. The beam 210 enters the detector layer 101 by transmitting through the contact layer 110 on the receiving side. Because the direction of the beam 210 is approximately parallel to the growth direction of the quantum well layers, the polarization of the beam 210 is approximately perpendicular to the growth direction (i.e., parallel to the layers). Hence, the intersubband absorption is small or about zero. The beam 210, essentially unabsorbed, reaches and interacts with the grating coupler 120 to become reflected diffraction beam 220. Only one diffraction beam 220 is shown but there are least two other reflected diffraction beams since the grating layer 120 has at least three grating directions. The grating coupler 120 is designed so that the diffraction beam 220 is not the zeroth order diffraction but instead one or more higher order diffractions. The diffraction beam 220 hence is not parallel to the input beam 210. When the diffraction beam 220 reaches the interface between the contact layer 110 and the air on the receiving side, it is reflected back to the detector layer 101 as a beam 230 because of the index difference at the interface. The beam 230 is not parallel to the input beam 210 and hence can be continuously absorbed by the detector layer 101. The thickness H of the detector layer 101 can be purposefully made much smaller than its width W so that the diffraction beam 220 can be reflected multiple times within the detector layer 101 before it reaches the side boundary to increase the light absorption and thus the detection efficiency. For example, in one implementation, the width W of each detector region in the detector layer 101 may be about 30 microns and the thickness H of the layer 101 may be only about 3 microns.

FIG. 3 shows one embodiment 300 of the grating coupler 120 of FIG. 1, where each grating cell, e.g., 301 and 302, is a hexagon with six sides 312A, 313A, 314A, 312B, 313B, and 314B. All hexagon grating cells are in the same orientation and are arranged in a periodic pattern. Any two adjacent cells are separated by a constant spacing D. This grating coupler 200 has three grating directions G1, G2, and G3, each angularly rotated by an equal amount of 120 degrees from another. The opposing and parallel pair of sides 212A and 212B define a first grating direction G1, the pair of sides 213A and 213B define a second grating direction G2, and the pair of sides 214A and 214B define a third grating direction G3. The grating period for each grating direction is the spacing D between the cells.

Referring to the grating cell 302, each grating cell has a central region 310 and a peripheral region 320. The peripheral region 320 surrounds the central region 310 and conforms to the boundary of the central region 310. The regions 310 and 320 of each cell are configured to have different characteristics so that the optical interaction spatially varies from the region 310 to the region 320 in each cell. This spatial variation may be the phase delay of each reflected light ray. For example, regions 310 and 320 may have different thickness values so that a light ray reflected from region 310 has a different phase delay than a reflected light ray from the region. The regions 310 and 320 may also have different indices of refraction so the phase delays upon reflection in the regions 310 and 320 are different.

In addition, the regions 310 and 320 may be designed so that the difference in the phase delay upon reflection for a normal incident ray at the different regions 310 and 320 is approximately 180 degrees. This condition can reduce or minimize the amount of energy in the zeroth order diffraction (the geometrical reflection beam) and hence increase the diffraction energy in one or more selected high-order diffractions. Under this condition, the different in the optical thickness (i.e., the index multiplied by the physical thickness) of the regions 310 and 320 should be one quarter of one wavelength of the radiation to be detected.

Furthermore, the areas of the regions 310 and 320 may be set so that the total reflected power from the central region 310 is approximately equal to the total reflected power from the peripheral region 320 from each cell. This effect, in a combination with the above difference in the phase delay of about 180 degrees, can be used to essentially eliminate the zeroth order diffraction by the grating coupler 120. In general, the regions 310 and 320 may have different areas when their indices of refraction are different. In an implementation where regions 310 and 320 have the same index of refraction, their areas can be set equal.

FIGS. 4A and 4B show two configurations of the hexagonal design shown in FIG. 3. In FIG. 4A, the thickness of the central region 310 is less than that of the thickness of the peripheral region 320. FIG. 4B shows the opposite situation.

Assuming the grating layer 120 extends infinitely, the angles of the m-th order diffraction can be written as $$\mathrm{Sin}(\Theta_m) = m\lambda/D - \mathrm{Sin}(\Theta), (m = \ldots -2, -1, 0, 1, 2, 3, \ldots)$$

where $\Theta_m$ is the m-th order diffraction angle, $\Theta$ is the incident angle, $\Lambda$ is the wavelength of the input beam within the grating layer 120, and D is the grating period for along each grating direction. The angles $\Theta_m$ and $\Theta$ are measured from the normal direction of the detector layer 101. Hence, the polarization component along the growth direction of the quantum-well layers is proportional to $\cos(\Theta_m)$. Therefore, it may be desirable to set the value of the grating period D so that, for a given input wavelength $\lambda$, the diffraction angle $\Theta_m$ is as large as being practically possible and the zero-th order diffraction (reflection) is substantially suppressed. The coupling efficiency for along each grating direction is $\cos^2(\Theta_m)$.

The grating layer 120 may be further designed so each grating direction produces two diffraction orders. For example, the grating cells may be designed to diffract all energy into the ±1 diffraction orders for each grating direction. Referring back to FIG. 2, the input beam 210 is shown to be diffracted into diffraction beams 220 and 240. Since there are at least 3 grating directions, 6 or more reflected diffraction beams are produced. This can significantly increase the detection efficiency.

The above polygon design of each grating cell allows the two-dimensional grating coupler 120 to diffract an input beam along three or more different directions. Hence, the grating coupler 120 can diffract more light at higher diffraction orders than a grating coupler with only one or two grating directions. However, there may be a trade-off between the effective diffracting area and the number of grating directions in the grating coupler 120. Octagonal grating cells or other more complex grating cells may be used to increase the number of the grating directions. However, these and other cell geometries have "dead" spaces between adjacent cells. The hexagonal design with six equal polygon sides can be used to achieve a fill factor of 100%, which may be better than other cell designs.

The exemplary detector 100 shown in FIGS. 1 and 2 uses an integrated structure without a substrate. This structure may be fabricated by the following process. First, a semiconductor substrate is prepared and the doped contact layer 110 is formed over the substrate by using, for example, the molecular beam epitaxy. Then, the multiple quantum well layers are formed over the contact layer 110 to form the detector layer 101. Next, the contact layer 120 is formed and patterned to have the array of polygon grating cells. This may be achieved by first using the photolithography or electron beam lithography to print the pattern of the polygon pattern array on the contact layer 120 and then etching the exposed layer 120 by, e.g., chemical or reactive ion etching, to form the polygon pattern array. Subsequently, the top reflective layer 130 is formed. The above process completes fabrication of all layers in the detector 100. Then underlying substrate is removed to form the detector 100.

Alternatively, the substrate may be retained. The contact layer 110 may be positioned between the quantum well detector layer 101 and the substrate where the substrate is used to receive and transmit the input radiation to the detector layer 101. The contact layer 110 may also be positioned so that the detector layer 101 is direction formed over one side of the substrate and the contact layer 110 is formed on an opposite side of the substrate. In this case, the substrate is doped so the electrical potential on the contact layer 110 can be applied to the detector layer 101.

The materials for various structures in the above designs may be selected according to the requirements for the applications. For example, the receiving contact layer 101 may be GaAs or InP with a thickness about 0.4 micron. The quantum well detector layer 101 may typically include about 50 period of alternatively-grown quantum well layers and barrier layers of a total thickness in a range about 2.5–3.0 microns. The quantum well structure may use a combination of GaAs, AlGaAs, InAlAs, InGaAs, InGaAsP, or InP. The grating coupler 120 may use GaAs of about 0.2 micron in its thickness. The grating depth, i.e., the difference between the regions 310 and 320 of a cell may be about 0.8 micron. The top metal reflector may be formed of a metal such as gold, about 0.05 micron thick. The dimension of each quantum well detector along the quantum well layers is set to include multiple grating cells. For example, this dimension may be about 30 microns.

A number of embodiments of the invention have been described. Nevertheless, it will be understood that various modifications and enhancements may be made without departing from the following claims.

What is claimed is:

1. A device, comprising:
   a detector layer having multiple quantum-well layers and responsive to radiation with a polarization component substantially parallel to said quantum-well layers; and
   a grating layer formed over said detector layer to have a two-dimensional array of grating unit cells and to diffract an input beam into at least one diffraction direction not perpendicular to said quantum-well layers, each unit cell shaped to define at least three different grating directions within said grating layer,
   wherein each unit cell includes a central region and a peripheral region conforming to and surrounding said central region,
   wherein central region and said peripheral region have different characteristics to effectuate a phase difference between a light ray reflected from said peripheral region and another light ray reflected from said central region.

2. The device as in claim 1, wherein said central and said peripheral regions have different thicknesses.

3. The device as in claim 2, wherein said central region and said peripheral region have a thickness difference substantially equal to one quarter of one wavelength of said input beam.

4. The device as in claim 2, wherein said central and said peripheral regions of each cell are configured to reflect about the same amount of optical power.

5. The device as in claim 2, wherein said central region has an area substantially equal to an area of said peripheral region.

6. The device as in claim 1, wherein each unit cell is shaped as a hexagon to have three pairs of parallel and opposing sides which are perpendicular to said three grating directions, respectively.

7. The device as in claim 1, wherein each unit cell is a polygon with an even number of sides greater than six.

8. The device as in claim 1, further comprising:
   a reflective layer directly formed over said grating layer; and
   a transparent layer formed on one side of said detector layer opposing an opposite side that has said grating layer.

9. The device as in claim 8, wherein both of said reflective layer and said transparent layer are electrically conductive to couple an electric bias to said detector layer.

10. A device, comprising:
    at least one quantum-well detector formed of quantum-well layers; and
    a grating layer formed over a first side of said detector to have a two-dimensional array of grating cells to diffract an input beam into a least one diffraction direction not perpendicular to said quantum-well layers, each cell being a polygon with at least three pairs of parallel and opposing sides to define at least three different grating directions.

11. The device as in claim 10, wherein each grating cell is a polygon with at least six sides and includes a central region and a peripheral region conforming to and surrounding said central region, wherein central region and said peripheral region have different characteristics to effectuate a phase difference of about 180 degrees between a light ray reflected from said peripheral region and another light ray reflected from said region.

12. The device as in claim 10, wherein said detector has a dimension along said quantum-well layers greater than a total thickness of said quantum well layers so that a reflected beam along said diffraction direction is reflected by both sides of said quantum well layers said detector at least once to transverse said quantum well layers at least twice.

13. The device as in claim 10, wherein said grating layer is formed of a doped semiconductor to provide an electrical potential to said detector.

14. The device as in claim 13, further comprising a transparent contact layer on a side of said quantum well layers opposing said layer, wherein said contact layer is formed of a doped semiconductor.

15. The device as in claim 10, wherein each grating cell is a hexagon cell with equal six sides.

16. A device, comprising a grating layer having a two-dimensional array of grating cells, each cell being a polygon with at least three pairs of parallel and opposing sides to define at least three different grating directions, wherein each grating cell includes a central region and a peripheral region conforming to and surrounding said central region, which have a difference in their optical thickness values about one quarter of a selected radiation wavelength.

17. The device as in claim 16, wherein said central region has an index of refraction different from an index of refraction of said peripheral region.

18. The device as in claim 16, wherein said central and said peripheral regions of each cell are configured to reflect about the same amount of optical power.

19. A method, comprising:

preparing a substrate;

forming a first contact layer over said substrate;

forming a detector layer over said first contact layer to include a plurality of quantum-well layers;

forming a second contact layer over said detector layer;

patterning said second contact layer to form a periodic array of polygon cells to define at least three grating directions, each cell having a central region and a peripheral region with different characteristics to cause different phase delays in reflecting input light rays; and removing said substrate from a structure which includes said first contact layer, said detector layer, and said patterned second contact layer.

20. The device as in claim 1, wherein said multiple quantum-well layers include GaAs.

21. The device as in claim 10, wherein said multiple quantum-well layers include GaAs.

* * * * *

UNITED STATES PATENT AND TRADEMARK OFFICE
CERTIFICATE OF CORRECTION

PATENT NO.     : 6,423,980 B1
DATED          : July 23, 2002
INVENTOR(S)    : Sumith V. Bandara et al.

It is certified that error appears in the above-identified patent and that said Letters Patent is hereby corrected as shown below:

<u>Title page,</u>
Item [75], please correct the inventor order as follows:
-- [75]  Inventors: Sumith V. Bandara,; Sarath D. Gunapala, both of Stevenson Ranch; Daniel W. Wilson of Glendale; John K. Liu of Pasadena, all of CA (US) --

Signed and Sealed this

Tenth Day of June, 2003

JAMES E. ROGAN
*Director of the United States Patent and Trademark Office*